United States Patent [19]
Wei et al.

[11] Patent Number: 5,728,612
[45] Date of Patent: Mar. 17, 1998

[54] METHOD FOR FORMING MINIMUM AREA STRUCTURES FOR SUB-MICRON CMOS ESD PROTECTION IN INTEGRATED CIRCUIT STRUCTURES WITHOUT EXTRA IMPLANT AND MASK STEPS, AND ARTICLES FORMED THEREBY

[75] Inventors: Hua-Fang Wei, Sunnyvale; Michael Colwell, Fremont, both of Calif.

[73] Assignee: LSI Logic Corporation, Milpitas, Calif.

[21] Appl. No.: 684,022

[22] Filed: Jul. 19, 1996

[51] Int. Cl.$^6$ .................................. H01L 21/8238
[52] U.S. Cl. ................. 438/200; 438/133; 438/202; 438/228
[58] Field of Search .................. 437/56, 57, 58, 437/59, 34, 6, 27, 30, 41 RCM; 438/200, 202, 133

[56] References Cited

U.S. PATENT DOCUMENTS

| | | | |
|---|---|---|---|
| 4,966,858 | 10/1990 | Masquelier et al. | 437/27 |
| 5,030,581 | 7/1991 | Yakushiji et al. | 437/29 |
| 5,140,401 | 8/1992 | Ker et al. | 257/360 |
| 5,225,702 | 7/1993 | Chatterjee | 257/360 |
| 5,343,053 | 8/1994 | Avery | 257/362 |
| 5,346,835 | 9/1994 | Malhi et al. | 437/29 |
| 5,369,041 | 11/1994 | Duvvury | 437/6 |
| 5,400,202 | 3/1995 | Metz et al. | 361/56 |
| 5,430,595 | 7/1995 | Wagner et al. | 361/56 |

*Primary Examiner*—Michael Trinh
*Attorney, Agent, or Firm*—John P. Taylor

[57] ABSTRACT

A method and resulting structure is disclosed for extending or enlarging the effective volumes of one or more source, drain, and/or emitter regions of integrated circuit structures such as an SCR structure and/or an MOS structure designed to protect an integrated circuit structure from damage due to electrostatic discharge (ESD). The additional effective volume allows the SCR and/or MOS protection devices to handle additional energy from an electrostatic discharge applied, for example, to I/O contacts electrically connected to the SCR protection structure. The additional effective volume is obtained, without additional doping or masking steps, by forming individual deep doped regions or wells, beneath one or more heavily doped source, drain, and emitter regions, at the same time and to the same depth and doping concentration as conventional main P wells and/or N wells which are simultaneously formed in the substrate, whereby no additional masks and implanting steps are needed.

4 Claims, 10 Drawing Sheets

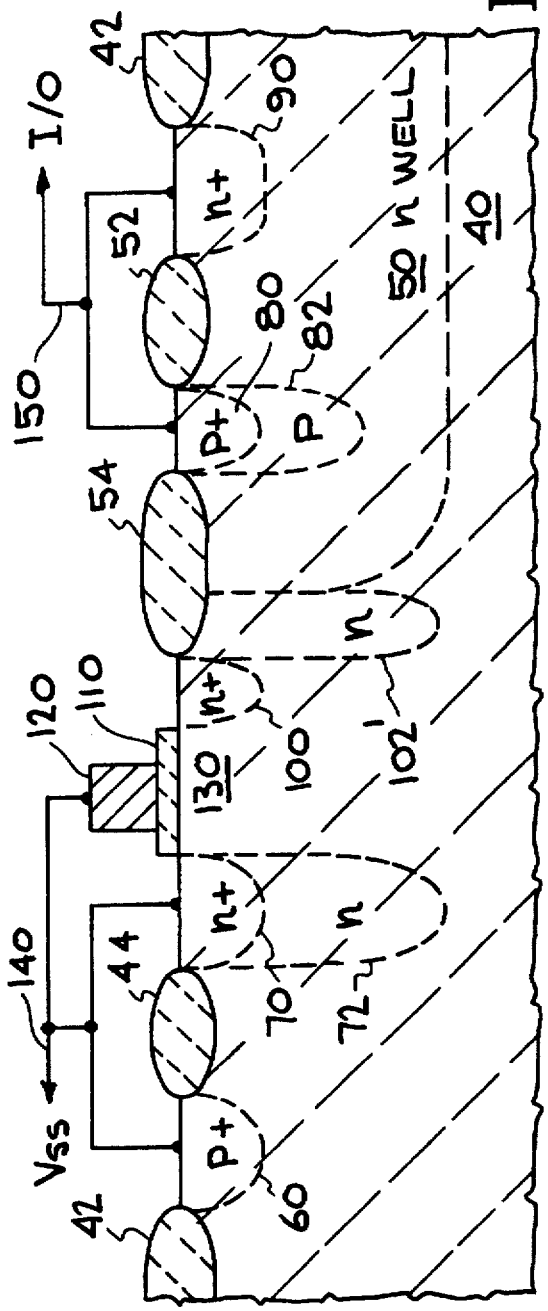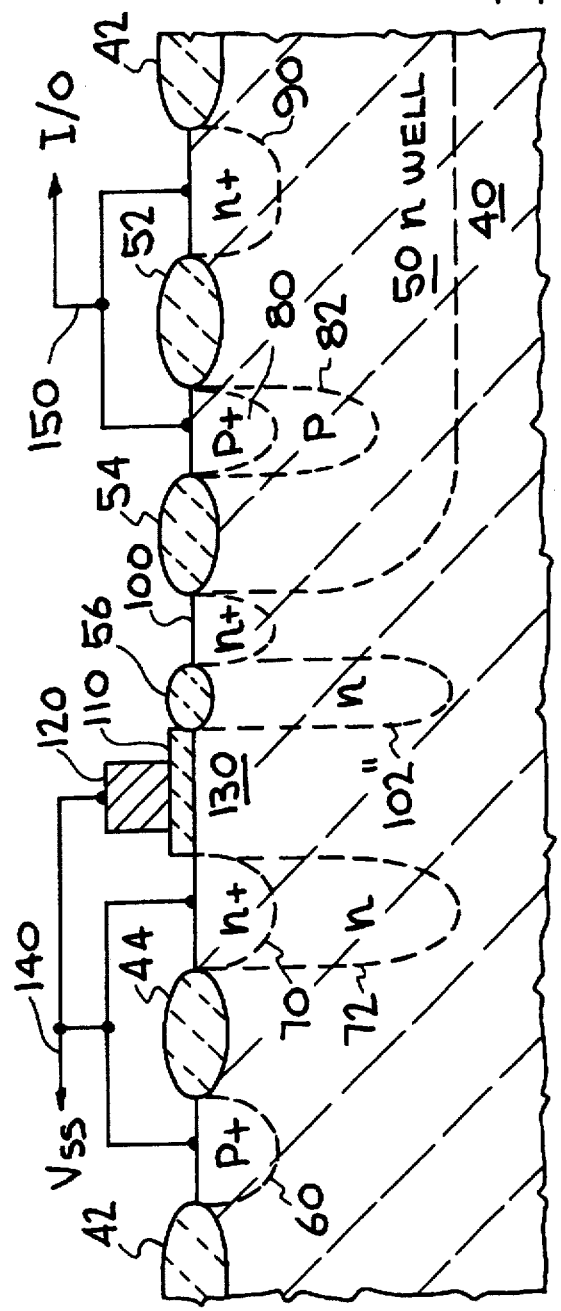

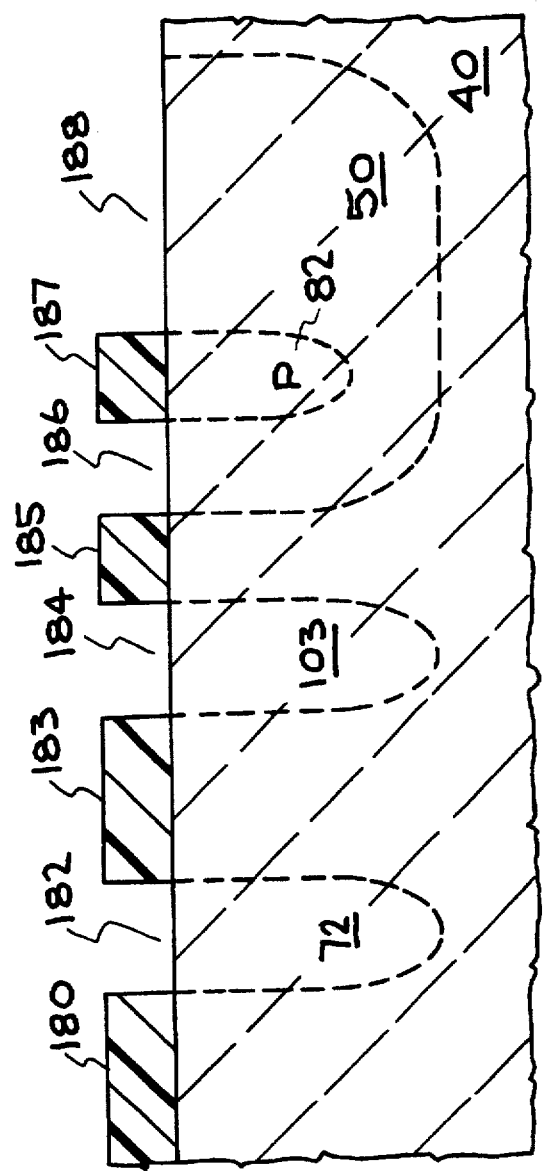

5,728,612

METHOD FOR FORMING MINIMUM AREA STRUCTURES FOR SUB-MICRON CMOS ESD PROTECTION IN INTEGRATED CIRCUIT STRUCTURES WITHOUT EXTRA IMPLANT AND MASK STEPS, AND ARTICLES FORMED THEREBY

BACKGROUND OF THE INVENTION

1. Field of the Invention

This invention relates to provision of electrostatic discharge (ESD) protection for CMOS semiconductor devices in integrated circuit structures. More particularly, in one embodiment this invention relates to provision of electrostatic discharge protection for CMOS semiconductor devices using an SCR structure formed in a minimum area without using an additional implant and mask to provide ESD protection; and in another embodiment, the invention comprises improvements in the buffer portion of the integrated circuit structure to provide the ESD protection without the use of the SCR structure.

2. Description of the Related Art

It is important to prevent damage to gate oxides at input buffers and to NMOS components at bidirectional buffers and output drivers caused by electrostatic discharge (ESD). To prevent such damage, an on-chip ESD protection structure must be triggerable and release a built-up charge at a voltage substantially below the breakdown voltages for the gate oxides and NMOS components.

Some prior art structures have been proposed to provide ESD protection. However, at least in some cases, such protective circuitry require the low voltage triggering of structures which include a parasitic lateral NPN transistor and a linked parasitic vertical PNP transistor. However, this can also cause voltage latchup to occur in the CMOS structure being protected against ESD damage. Such voltage latchup is unacceptable and alternate means for providing ESD protection have, therefore, been explored.

In a related application entitled "ESD PROTECTION FOR DEEP SUBMICRON CMOS DEVICES WITH MINIMUM TRADEOFF FOR LATCHUP BEHAVIOUR", previously filed by one of us on Nov. 13, 1995, as U.S. patent application Ser. No. 08/556,599, assigned to the assignee of this invention, and the disclosure of which is hereby incorporated by reference herein, an SCR structure was disclosed and claimed to provide ESD protection. This structure is generally shown in FIG. 1. This structure provides a tunable low voltage-triggering SCR in which triggering occurs at voltages in the range of 5–20 volts.

In the structure of the aforementioned Ser. No. 08/556, 599, as shown in FIG. 1, a P doped substrate 2 is provided with a P+ contact region 4 which provides an electrical contact to substrate 2. An N+ source region 6, also formed in substrate 2, is separated from P+ contact region 4 by a first field oxide region 8. N+ source region 6 comprises the source for the MOSFET of the SCR structure which provides the ESD protection. An N well 10 is also provided in substrate 2 and has a P+ emitter region 12 formed therein as well as an N+ contact region 14 formed therein, with N+ contact region 14 serving as an electrical contact to main N well 10. P+ emitter region 12 and N+ contact region 14 are separated from one another by a second field oxide region 16. At the edge of main N well 10 and shown in physical and electrical contact with main N well 10 is an N+ floating drain region 18 which serves as the drain for the MOSFET of the SCR structure. Floating drain region 18 further serves as the base of the lateral parasitic PNP bipolar transistor. N+ floating drain region 18 is separated from P+ emitter region 12 by a third field oxide region 20.

In the illustrated embodiment, a gate oxide layer 22 is formed on the surface of substrate 2 between N+ source contact region 6 and N+ floating drain region 18, with a polysilicon gate electrode 24 formed over gate oxide 22. A channel region 26 lies in substrate 2 beneath gate oxide layer 22.

P+ contact region 4, N+ source region 6, and gate electrode 24 are electrically connected together by a first electrically conductive bus member 28 which is, in turn, electrically connected to ground, e.g., a Vss bus. First electrically conductive member 28 may comprise one or more doped polysilicon layers or one or more metal layers, or a combination thereof as is well known to those skilled in the an of forming electrical busses for integrated circuit structures. P+ emitter region 12 and N+ contact region 14 are electrically connected together by a second electrically conductive bus member 30 to a portion of the integrated circuit structure to be protected against damage by ESD, such as for example, an input/output (I/O) pin.

The structure disclosed and claimed in Ser. No. 08/556, 599, and the process of making same, includes the use of retrograde well fabrication or conventional well implant and epitaxial methods to form the different P well and N well regions; replacement of a field oxide with a thinner gate oxide region under a polysilicon MOSFET gate region; connection of the polysilicon MOSFET gate region to a grounded electrode rather than to the I/O electrode; use of buffered contacts rather than the prior an use of unbuffered contacts; achievement of relatively low dynamic or differential resistance in the on-state, which reduces the associated ESD resistance; use of a thin guard band that is integrated with one of the tap regions to suppress minority carrier injection and to control development of latchup due to SCR electrode injection during latchup testing and subsequent operation; and recognition and treatment of the role of development and triggering of lateral and vertical bipolar transistor action in promoting or initiating ESD in an SCR.

In this regard, it should be noted that in providing ESD protection for submicron integrated circuit devices, a low triggering voltage and low associated resistance for the ESD triggering device are both desired. However, these desired features are often inconsistent with desired core performance characteristics where high triggering voltage of parasitic bipolar devices is built in to suppress development of latchup in the device. The ESD protective device described and claimed in the aforementioned patent application Ser. No. 08/556,599, provides good ESD protection without, however, sacrificing latchup protection.

While the structure and method proposed in the aforementioned patent application Ser. No. 08/556,599, has provided satisfactory protection against ESD without sacrificing latchup protection, the structure shown in FIG. 1 is limited in the size required to dissipate the energy or power from an electrostatic discharge of 2 kV from a human body (a human body model or HBM zapping). As seen in FIG. 1, the length of the circuitry required to provide the desired ESD protection is fixed by the devices themselves. In order to provide sufficient dissipation of such a 2 kV HBM zapping, i.e., in order to be large enough to handle the energy or power from a 2 kV HBM zapping (for average junction depths of 0.2 micrometers (μm) or less), the width of the circuitry (the direction into the paper in FIG. 1) would have to be at least about 2.5 mils (about 63.5 μm). However, the requirements for smaller sizes with shrinking dimensions of the integrated circuits structures make this size unacceptable for certain applications. It would, therefore, be desirable to provide the circuitry of the aforementioned patent application Ser. No. 08/556,599, constructed in such a way as to occupy a smaller area of the substrate on which the ESD protection structure of the integrated circuit structure is formed.

SUMMARY OF THE INVENTION

The invention provides a method and resulting structures for extending or enlarging the effective volumes of one or more source, drain, and/or emitter regions of integrated circuit structures such as an SCR structure and/or an MOS structure designed to protect an integrated circuit structure from damage due to electrostatic discharge (ESD). The additional effective volume allows the SCR and/or MOS protection devices to handle additional energy from an electrostatic discharge applied, for example, to I/O contacts electrically connected to the SCR protection structure. The additional effective volume is obtained, without additional doping or masking steps, by forming deep doped regions or wells, beneath one or more heavily doped source, drain, and emitter regions, at the same time and to the same depth and doping concentration as conventional P wells and/or N wells which are simultaneously formed in the substrate, whereby no additional masks and implanting steps are needed.

BRIEF DESCRIPTION OF THE DRAWINGS

FIGS. 5–11 are fragmentary vertical cross-sectional views of alternate embodiments to the structure shown in FIGS. 2 and 3, illustrating the various structural ways in which the overall effective volume of the source, drain, and/or emitter regions of the ESD protection structure may be increased to thereby increase the total amount of energy which can be absorbed and dissipated by the ESD protection structure while either maintaining the same width in the area of the substrate occupied by the ESD protection structure or while reducing the width dimension of the area.

FIG. 12 is a fragmentary vertical cross-sectional view showing an initial stage of construction of the ESD protection structure of the invention showing formation of the main N well and the simultaneous formation of the small N wells of the same depth which are associated with the N+ source and drain regions of the MOSFET device of the SCR structure, as well as a small P well beneath the P+ emitter, to extend the respective effective volumes of the N+ source and drain regions and the P+ emitter region to thereby increase the overall volume of the ESD protection structure of the invention.

FIG. 13 is a fragmentary vertical cross-sectional view showing the masking of the active regions of the substrate while field oxide is grown to provide electrical isolation between the respective active regions.

DETAILED DESCRIPTION OF THE INVENTION a. Description of the Preferred Embodiment of the Structure

Figure 2:
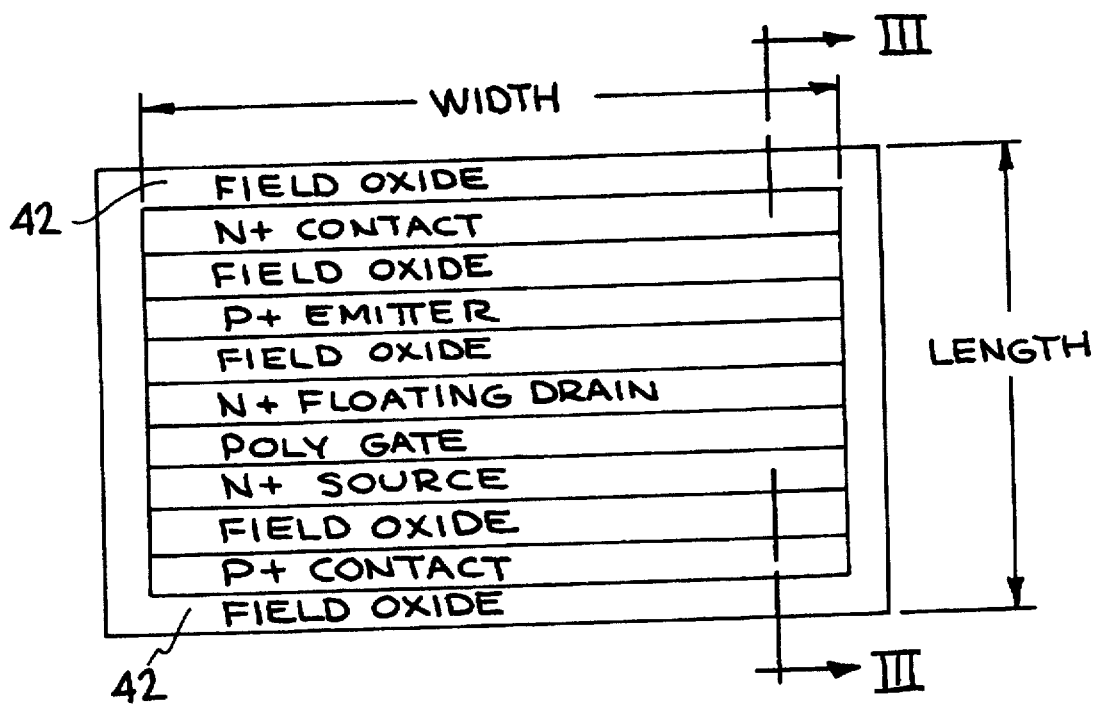
FIG. 2 is a top view showing the area on a semiconductor substrate occupied by a preferred embodiment of the ESD protection structure of the invention, showing the dimension defined as length and the dimension defined as width in the area of the ESD protection structure.
Figure 3:
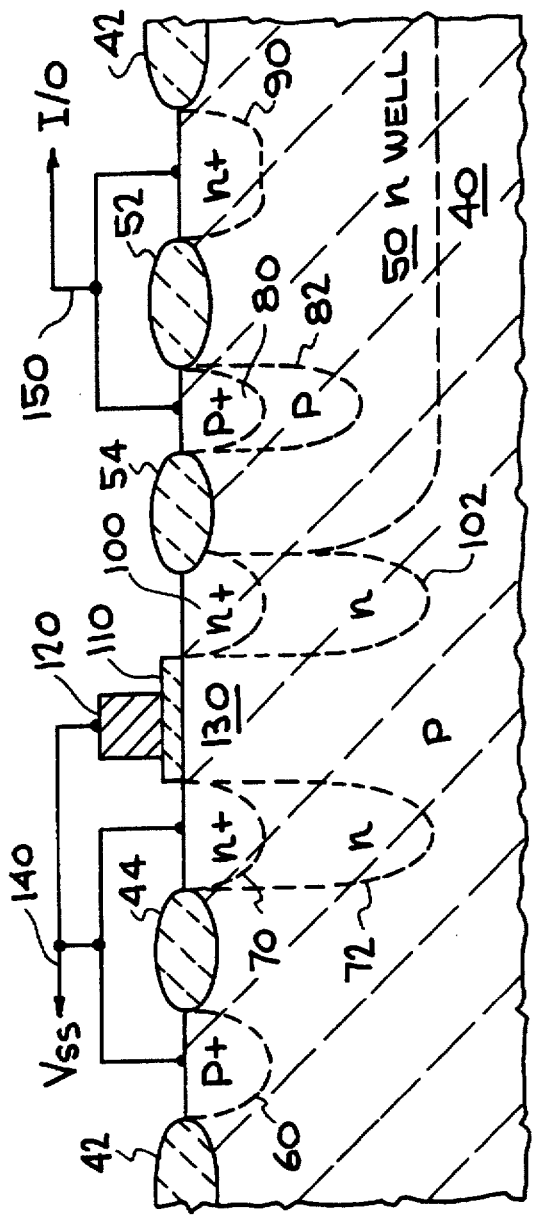
FIG. 3 is a fragmentary vertical side section view of the ESD protection structure of the invention, taken along lines III—III of FIG. 2, showing a preferred embodiment of the ESD protection structure of the invention along its length.
Figure 4:
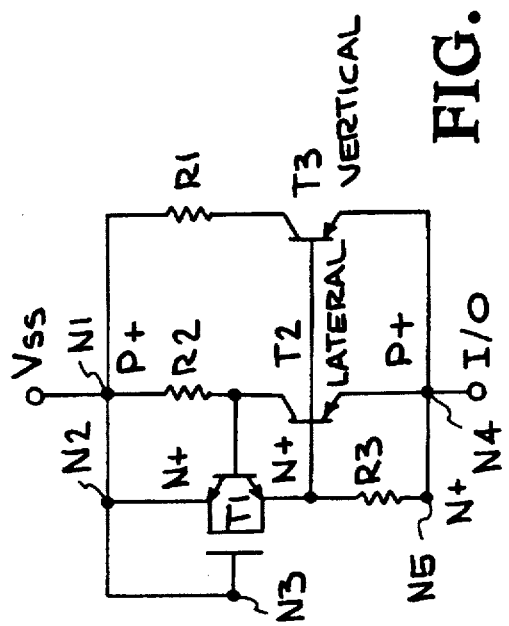
FIG. 4 is a schematic view of the electrical circuitry defined by the ESD protection structure shown in FIG. 3.

FIGS. 2–4 illustrate a structure designed in accordance with the invention to protect an integrated circuit structure on a semiconductor substrate against damage from ESD. The ESD protection structure comprises an SCR structure having one or more source, drain, and/or emitter regions effectively increased in volume to permit the SCR structure to handle additional energy from an electrostatic discharge, i.e., increasing the ESD energy which the ESD protection structure is capable of absorbing, without, however, increasing the width of the SCR structure.

Figure 1:
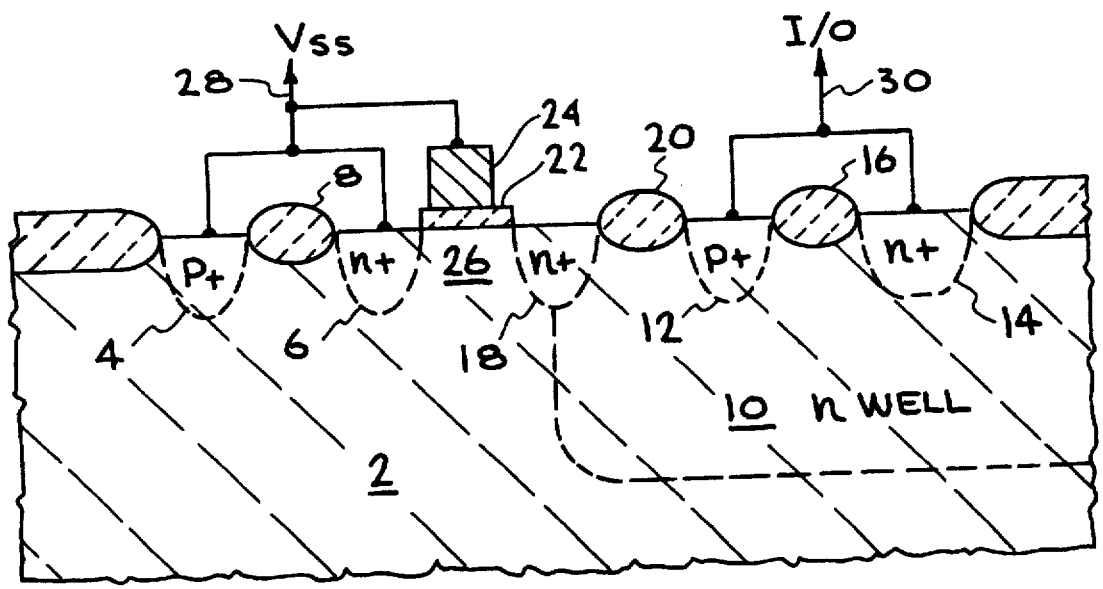
FIG. 1 is a fragmentary vertical side section view of the ESD protection device described and claimed in Ser. No. 08/556,599.

Alternatively, the ESD protective structure is capable of handling the same amount of energy as the structure shown in FIG. 1, but with reduced width, due to the added depth of the active regions which can provide the same effective volume, but with reduced width. In this regard, it should be noted that the distribution of the volume of the active source, drain, and emitter regions of the SCR protective structure more evenly across all three dimensions (width, length, and depth) may provide enhanced peak protection against ESD.

When the area of the substrate taken occupied by the ESD protection structure is to be reduced, it must be reduced in the width direction rather than the length, as indicated in FIG. 1, since any substantial changes in the length could change the SCR triggering voltage. As used herein with respect to the area occupied by the ESD protection structure, the term "length" is intended to define the direction of current flow in the SCR structure, i.e., the direction in which the channel length of the MOSFET device of the SCR structure is measured, while the term "width" is intended to define the space occupied by the SCR structure in the channel width direction of the MOSFET, i.e., perpendicular to the current flow.

For purposes of this application, an increase in volume of the SCR protection structure of the invention is intended to mean an increase in volume based on an increase in the effective depth of one or more of the source, drain, and/or emitter regions of the SCR structures in the ESD protection structure regardless of the any reduction in width of the SCR structure.

The use of the terms "individual N well" or "individual P well" is intended to define an N well or P well which is contiguous and in electrical contact with an individual P+ or N+ active region in the semiconductor substrate; while the terms "main N well" or "main P well" are intended to define a well of opposite conductivity to the substrate and formed in the substrate to permit the formation in such main well of a plurality of active regions of opposite conductivity type to the conductivity type of the main well.

Referring now in particular to FIGS. 2 and 3, a portion of a P doped semiconductor substrate 40 is shown in which the SCR structure of the invention will be constructed to provide the desired ESD protection. As particularly shown in FIG. 2, the active region of substrate 40 in which the SCR structure will be constructed is shown surrounded by field oxide 42. Substrate 40 has a main N well 50 formed therein using either a retrograde well implant process or a conventional well implant process. While the illustrated embodiment shows no P well because the P doped semiconductor substrate 40 is either blanket deposited or initially formed to form a P well of the entire substrate, it will be appreciated that a separate P well could also be formed, particularly if the substrate is either intrinsic or only lightly P doped.

Substrate 40 is provided with a P+ contact region 60 which provides an electrical contact to P doped substrate 40 (or to a P well when a P well is used). An N+ source region 70 is also shown formed in substrate 40 and separated from P+ contact region 60 by a second field oxide region 44. In the illustrated embodiment shown in FIG. 2, a source N well region 72 is shown formed below N+ source region 70, in accordance with the invention. Source N well region 72 has a depth equal to the depth of main N well 50, which, in accordance with the invention, enables both N wells to be simultaneously formed using the same masking and implantation steps, as will be discussed below. Source N well region 72 serves to extend the overall effective volume of N+ source region 70 of the SCR used in the ESD protection structure to enable the ESD protection structure to dissipate an increased amount of energy from the ESD. As will be discussed below, the exact shape and location of the source N well region associated with N+ source region 70 may vary, so long as it remains in physical and electrical contact with N+ source region 70, and its depth remains the same as main N well 50.

First P+ contact region 60 and N+ source region 70 preferably each have a length (as measured from left to right in the dimension illustrated in FIG. 3) of from about 1 μm (10,000 Angstroms (Å)) to about 9μm (90,000 Å), a width (the dimension into the paper in FIG. 3) of from about 1 mil (25.4 μm) to about 2.5 μmils (63.5 μm), and a depth (height) of from about 0.1 μm (1,000 Å) to about 0.2 μm (2,000 Å). First P+ contact region 60 and N+source contact region 70 preferably each have a carrier concentration of from about $10^{19}$ to about $10^{21}$ atoms/cm$^3$.

Field oxide region 44, separating P+ contact region 60 and N+ source region 70, has a thickness (depth) preferably ranging from about 20 nanometers (20 nm or 200 Å) to about 600 nm (6000 Å), and a length (distance between first P+ contact region 60 and N+ source region 70) of from about 0.1 μm (100 nm or 1,000 Å) to about 10 μm (10,000 nm or 100,000 Å).

A P+ emitter region 80 and a N+ contact region 90 are formed in main N well 50, with N+ contact region 90 serving as an electrical contact to main N well 50. P+ emitter region 80 and N+ contact region 90 preferably each have a carrier concentration of from about $10^{20}$ to about $10^{21}$ atoms/cm$^3$. P+ emitter region 80 and N+ contact region 90 are separated by a third field oxide region 52 which also has a thickness (depth) ranging from about 20 nm (200 Å) to about 600 nm (6000 Å), and a length (distance between second P+ contact region 80 and second N+ contact region 90) of from about 0.1 μm (100 nm or 1,000 Å to about 10 μm (10,000 nm or 100,000 Å). Formed below P+ emitter region 80 is a P well 82 which is preferably formed at the same time as N wells 72 and 102 and main N well 50, although not to the same depth (to prevent shorting of P well 82 to P substrate 40), as will be discussed below.

Adjacent the edge of main N well 50 is an N+ floating drain region 100 which serves as the drain for the MOSFET device of the SCR structure, but also as the base of a lateral parasitic PNP bipolar transistor as well as the base of a vertical PNP transistor, as will be discussed below with respect to FIG. 4. N+ floating drain region 100 preferably has a carrier concentration of from about $10^{19}$ to about $10^{20}$ atoms/cm$^3$. N+ floating drain region 100 is separated from second P+ contact region 80 by a fourth field oxide region 54. Formed below N+ floating drain region 100 is an N well 102 which, like N well 72, is formed to a depth equal to the depth of main N well 50. N well 102 is formed at the same time as main N well 50 and N well 72, as will be discussed below.

P+ emitter region 80, N+ contact region 90, and N+ floating drain region 100 each preferably have dimensions similar to P+ contact region 60 and N+ source region 70, i.e., a length (as measured from left to right in the dimension illustrated in FIG. 3) of from about 1 μm (10,000 Angstroms (Å)) to about 9 μm (90,000 μÅ), a width (the dimension into the paper in FIG. 3) of from about 1 mil (25.4μm) to about 2.5 mils (63.5 μm), and a depth (height) of from about 0.1 μm (1,000 Å) to about 0.2 μm (2,000 Å).

In the illustrated embodiment, a gate oxide layer 110 is formed on the surface of substrate 40 between N+ source region 70 and N+ floating drain region 100, with a gate electrode 120, preferably comprising doped polysilicon, formed over gate oxide 110. Gate oxide layer 110 preferably has a thickness ranging from about 7 nm (70 Å) to about 10 nm (100 Å), typically about 7 nm. A channel region 130 in substrate 40 beneath gate oxide layer 110 has a channel length of from about 0.1 μm (1,000 Å) to about 1 μm (10,000 Å).

P+ contact region 60, N+ source region 70, and gate electrode 120 are electrically connected together by a first electrically conductive bus member 140 which is, in turn, electrically connected to ground, e.g., a Vss bus. First electrically conductive bus member 140 may comprise one or more doped polysilicon layers or one or more metal layers, or a combination thereof as is well known to those skilled in the art of forming electrical busses for integrated circuit structures.

P+ emitter region 80 and N+ contact region 90 are electrically connected together by a second electrically conductive bus member 150 to a portion of the integrated circuit structure to be protected against damage by ESD, such as for example, an input/output (I/O) pin.

FIG. 4 illustrates an electrical schematic of the ESD protection device comprising the SCR and the associated lateral and vertical parasitic bipolar transistors and resistances previously shown in FIG. 3 to provide ESD protection to portions of an integrated circuit structure such as the I/O buffer circuits. Resistors R1 and R2 each represent resistances through substrate 40 (R2 could represent the resistance through a P well, if P+ contact region 60, N+ source region 70, and drain region 100 were formed in a P well instead of a P type substrate), while resistance R3 represents the resistance through main N well 50. Node points N1, N2, and N3 respectively correspond to first P+ contact region 60, N+ source region 70, and gate electrode 120 in FIG. 3, while nodes N4 and N5 respectively correspond to P+ emitter region 80 and N+ contact region 90 in FIG. 3. MOSFET transistor T1 in FIG. 4 corresponds to source region 70, gate oxide layer 110, gate electrode 120, and floating drain region 100 in FIG. 3. Lateral transistors T2 and T3 in FIG. 4 comprises the parasitic bipolar transistors formed between emitter region 80, P+ contact 60 (which serves as the collector for transistors T2 and T3), and floating drain region 100 (which serves as the base for transistors T2 and T3) in FIG. 3.

It will be noted that in contrast to the ESD protection structure described and claimed in aforementioned copending application Ser. No. 08/556,599, the effective volume of N+source region 70, N+ floating drain region 100, and P+ emitter region 80 have, respectively, been enlarged by the respective provision of source N well region 72, floating drain N well region 102, and P well region 82 which respectively extend below N+ source contact region 70, N+ floating drain region 100, and emitter region 80, with N wells 72 and 102 extending down to the same depth in substrate 40 as main N well 50, i.e., about 1 μm (~10,000 Å), while P well 82 extends down about 0.8 μm (~8,000 Å).

It should also be noted that while an increase in the effective respective volumes of N+ source region 70, N+ floating drain region 100, and P+ emitter region 80 have all been shown together, an increase in the amount of energy which may be dissipated, over the structure described and claimed in the aforementioned Ser. No. 08/556,599, may be obtained by extending the volume of any one or two of the source, drain, or emitter regions. However, since the extension of the effective volume of all of the source, drain, and emitter regions may be obtained, in accordance with the invention, without the need for additional processing steps or masks, as will be described below, it is preferable to extend the effective volume of all three active regions of the SCR structure together.

b. Description of Alternate Embodiments of the Structures

With respect to the exact shape of the N wells or P well, and their respective relationships to the disposition and shape of the N+ or P+ active regions, a number of different geometries may be effectively used. Referring now to FIGS. 5-11, other embodiments are shown comprising modifications of either the extended drain N well region 102 (FIGS. 5-7) or the extended source N well region 72 (FIGS. 8-11). Furthermore, the geometries illustrated in FIGS. 8-11 for modifications of N well region 70 may also be employed for modifications to P well 82 as well.

Referring now to FIG. 5, the effective volume of N+ floating drain region 100 has been increased by forming N well 102' adjacent N+ floating drain region 100 and under field oxide 54, rather than beneath N+ floating drain region 100 as in the previous embodiment shown in FIG. 3. It should be noted that N well 102' is positioned to be contiguous and in electrical contact with both main N well 50 and N+ floating drain region 100.

In FIG. 6, another variation of the increase in the effective volume of N+ floating drain region 100 is illustrated wherein an additional field oxide region 56 is formed between N+ floating drain region 100 and gate oxide 110 and an N well 102" is formed beneath field oxide region 56 which is contiguous, and in contact electrically, with N+ floating drain region 100 to thereby effectively extend the volume of N+ floating drain region 100.

Figure 7:
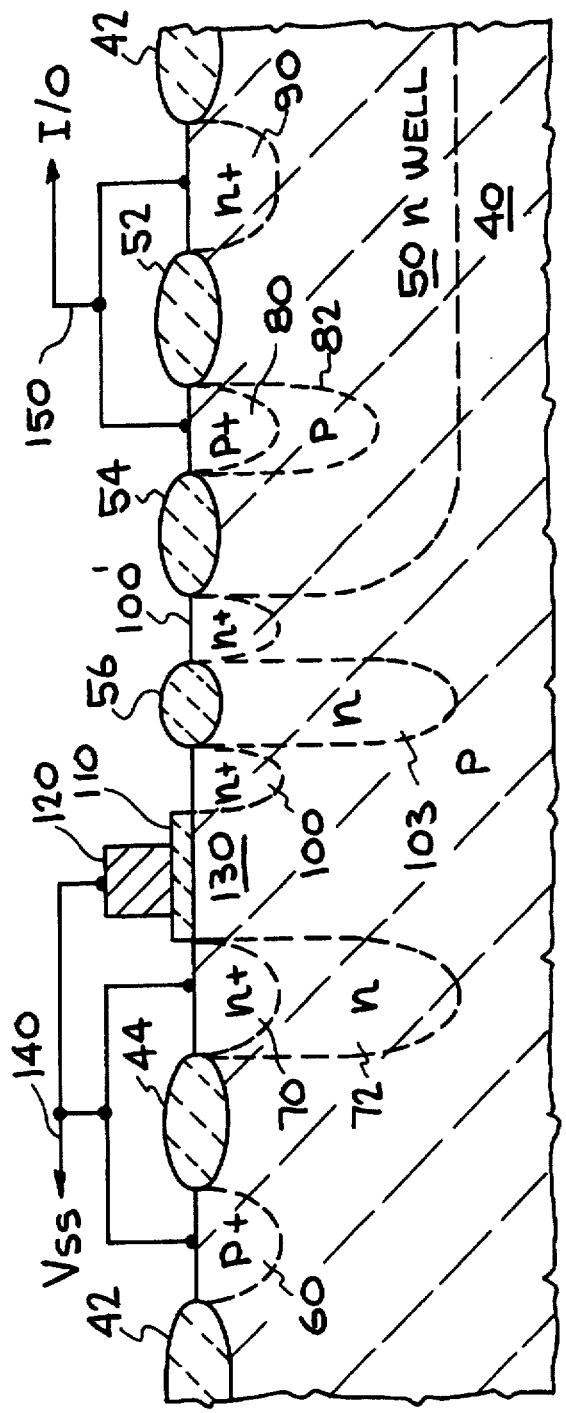

FIG. 7 shows another variation which also adds a field oxide region 56, but which also creates a second floating drain region 100' between field oxide regions 54 and 56. In this instance, an N well 103 is formed beneath field oxide region 56 which is contiguous with and electrically connected to both floating drain region 100 and floating drain region 100', thereby extending the effective volume of the floating drain region.

It should be further noted that the effective length of the N+ floating drain region spacing (between gate oxide 110 and main N well 50) should preferably remain substantially the same in all of the embodiments respectively shown in FIGS. 3, 5, 6, and 7, so that the electrical characteristics of the SCR structure do not change.

Figure 8:
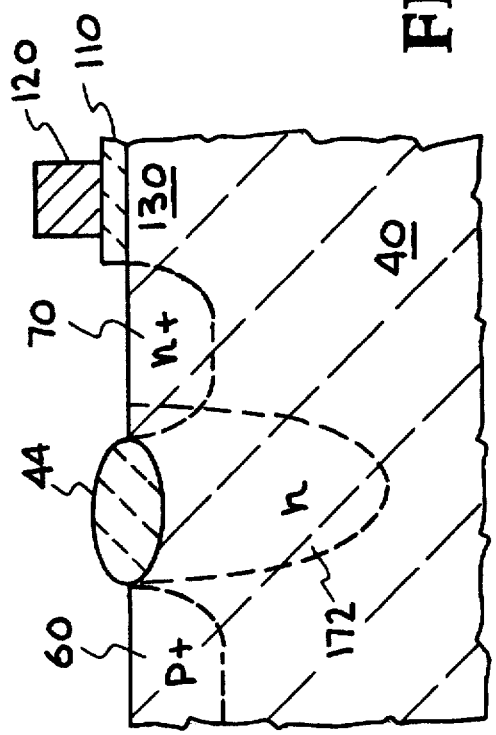
Figure 9:
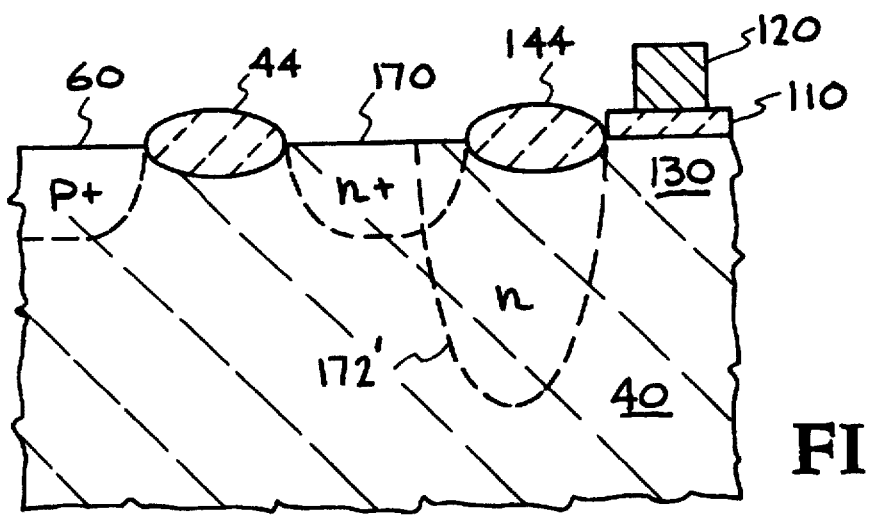

Turning now to FIGS. 8-11, other embodiments are illustrated which show different geometries for the N well(s) providing the increase in the effective volume of N+ source region 70. In FIG. 8, an N well 172 is shown formed beneath field oxide 44. N well 172, like N well 72 of the embodiment shown in FIG. 3, is contiguous and in electrical contact with N+ source region 70. FIG. 9 shows another embodiment wherein an additional field oxide region 144 is formed between N+ source region 170 and gate oxide 110, and N well 172' is then formed beneath field oxide region 144. Again, N well 172', like N wells 72 and 172, is contiguous and in electrical contact with the adjoining N+ source region (in this case N+ source region 170) to thereby provide the desired increase in effective volume of the N+source region in substrate 40, in accordance with the invention.

Figure 10:
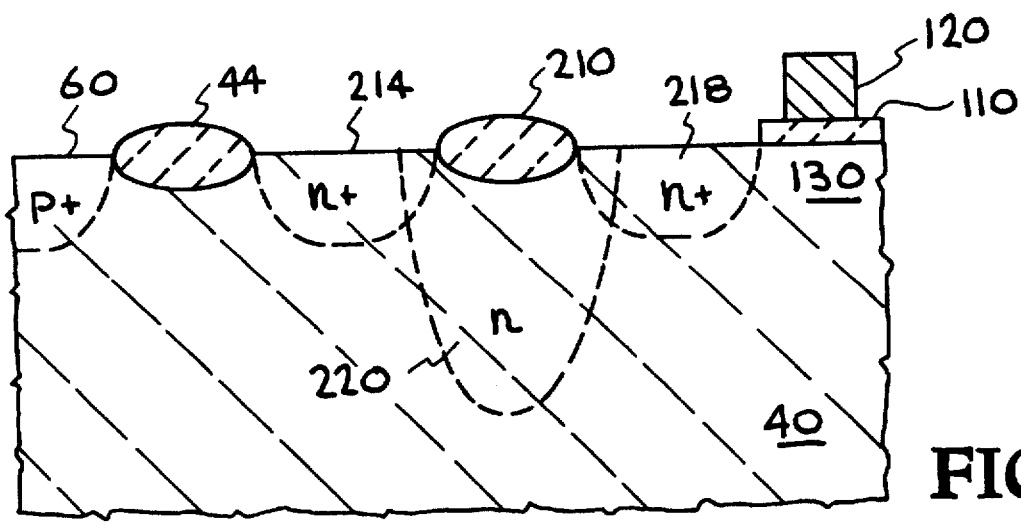
Figure 11:
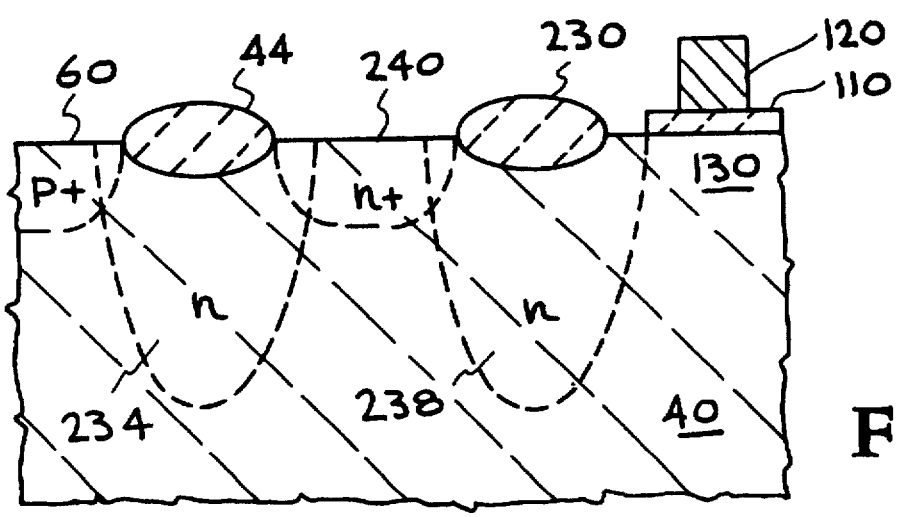

FIG. 10 shows yet another embodiment in which an additional field oxide region 210 is formed with an N well 220 formed beneath field oxide 210. In this embodiment, two N+source regions, 214 and 218, are formed, respectively, on each side of field oxide 210 with N+ source regions 214 and 218 both contiguous and in electrical communication with N well 220 to increase the effective volume of the combined N+ source region. In the embodiment of FIG. 11, a second field oxide region 230 is formed between N+ source region 240 and gate oxide 110 (similar to the embodiment of FIG. 9) and two N wells, 234 and 238, are then formed, respectively, beneath field oxide 44 and field oxide 230. N wells 234 and 238 are both formed contiguous and in electrical contact with N+ source region 240 to thereby increase the effective volume of N+ source region 240.

c. Description of the Process of Forming the Structure

As previously alluded to, one of the features of the invention is that the effective volume of one or more of the source, floating drain, and emitter regions can be extended by the provision of contiguous and electrically connected wells which can be formed without the use of extra masks or extra processing steps. Turning now to FIGS. 12-16, the process steps used to form the ESD protection structure of the embodiment of FIG. 7 will be illustrated.

First of all, as shown in FIG. 12, the main N well 50 is formed by the conventional doping of P type substrate 40 with an N dopant, such as phosphorus or arsenic, at an energy level sufficient to obtain the desired depth of main N well 50, but at a dosage level insufficient to form N+ doping. Conventionally, this would be carried out while masking the remainder of substrate 40, i.e., masking the regions where main N well 50 would not be formed. However, in accordance with the invention, photoresist mask 180 is formed with openings 182, 184, 186, and 188 (instead of a single mask opening 188 for formation of main N well 50). Mask opening 182 corresponds to the location where individual N well 72 beneath N+ source region 70 is to be formed in substrate 40, while mask opening 184 corresponds to the location where individual N well 103 will be formed in substrate 40 beneath field oxide region 56, with mask portion 183 separating these two individual N wells.

Mask openings 186 and 188 are formed in mask 180 to provide for the formation of main N well 50 in substrate 40, with mask portion 185 separating mask opening 186 from mask opening 184. The reason for two mask openings, separated by narrow mask portion 187, is to permit the formation of shallower P well 82 in main N well 50. Shallow P well 82 may be formed during the formation of N wells 82, 103 and main N well 50 simply by masking substrate 40, since substrate 40 is already P doped sufficiently to comprise a P well, so the purpose of mask portion 187 is merely to prevent the underlying P doped substrate to be N doped, thus resulting in the formation of P well 82. It should be noted, in this regard, that the length of mask portion 187 (distance between opening 186 and opening 188) may be varied to, in turn, regulate the length and depth of P well 82, i.e., the depth before the N doped substrate portion beneath mask opening 186 merges with the N doped substrate portion beneath mask opening 188 to form the single main N well 50 in substrate 40. Generally the length of mask portion 187 will usually be about ½ the length of mask portion 185.

After formation of N wells 72, 103, and main N well 50, as well as P well 82, mask 180 is removed, and all of the active area of substrate 40 is masked with a mask 190 having openings therein conforming to regions within the active area of substrate 40 where field oxide is to be grown, in addition to field oxide 42 which surrounds the active area. Thus, as shown in FIG. 13, field oxide portions 42, 44, 52, 54, and 56 are shown formed on and in substrate 40 in the openings in mask 190.

Figure 14:
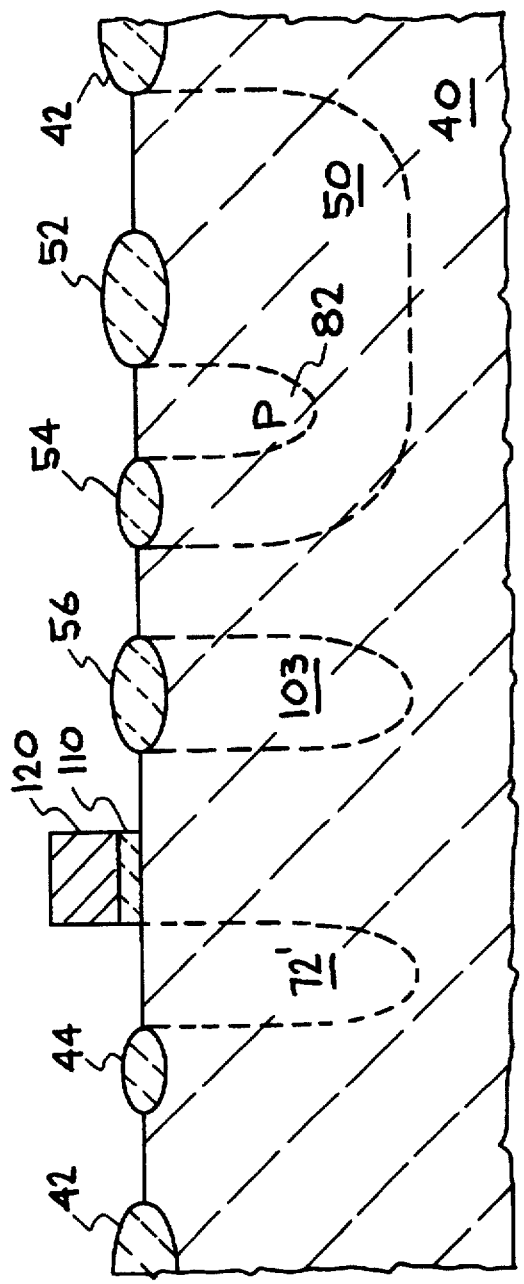
FIG. 14 is a fragmentary vertical cross-sectional view showing formation of the gate oxide and overlying gate electrode for the MOSFET device of the SCR structure of the invention.
Figure 15:
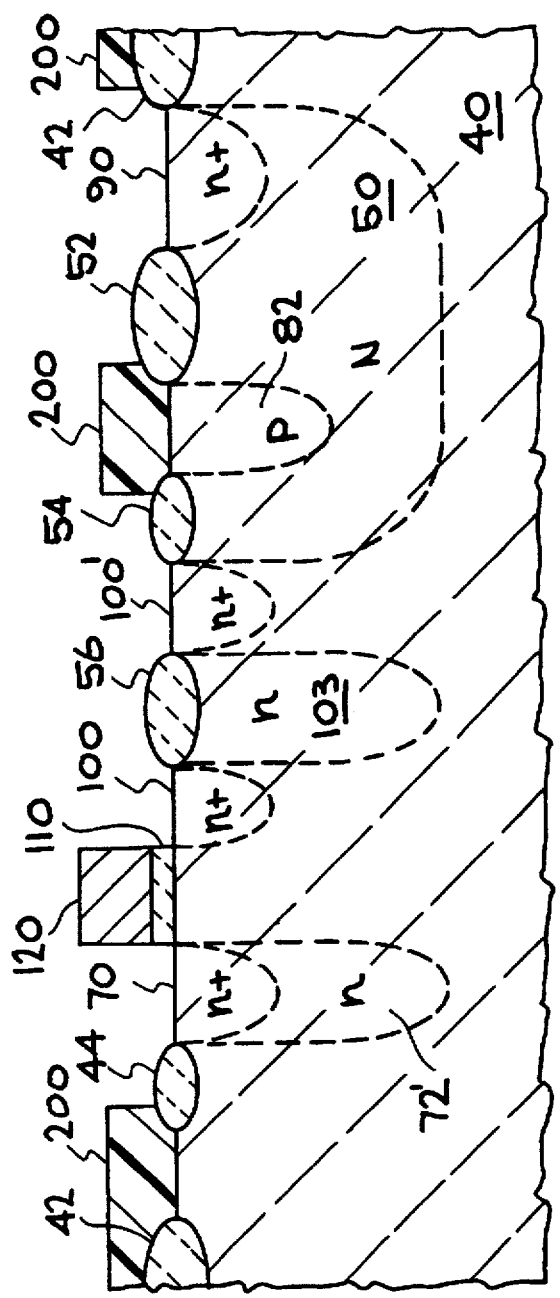
FIG. 15 is a fragmentary vertical cross-sectional view showing the N+ implantation of active regions of the substrate to form the N+ source, N+ drain and N+ contact for the N well, while other active regions are masked off.

Then, as shown in FIG. 14, field oxide mask 190 is removed and gate oxide 110 and gate electrode 120 are conventionally formed over the region of substrate 40 between N well 72 and N well 102. As shown in FIG. 15, N+ source region 70, N+ floating drain regions 100 and 100', and N+ contact region 90 may then be implanted by forming an implant mask 200 over portions of substrate 40 (including portions of main N well 50), leaving exposed only those portions where the N+ implantation is to be made. It should be noted that gate electrode 120 and the field oxide portions 42, 44, 52, 54, and 56 form a self-alignment mask for the respective formations of N+ source region 70, N+ floating drain regions 100 and 100', and N+ contact region 90.

Figure 16:
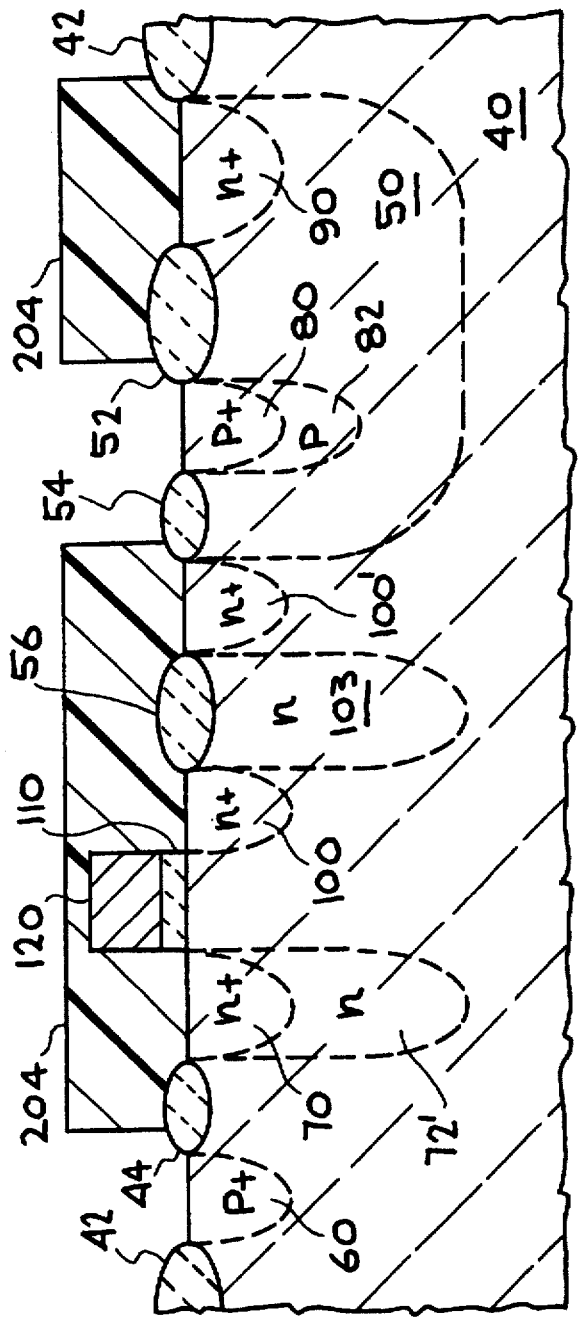
FIG. 16 is a fragmentary vertical cross-sectional view showing the P+ implantation of other active regions of the substrate where the P+ emitter and the P+ contact to the P substrate are formed, while other regions are masked off.

Following formation of the N+ regions, mask 200 may be removed and replaced with a second implant mask 204, as shown in FIG. 16, formed over the N+ implanted areas to permit formation of the P+ implants comprising P+ contact 60 and P+ emitter region 80.

It should be noted, in this regard, that the P+ and N+ implant steps may be reversed, as is well known to those skilled in the art. Furthermore, one of the implant masks, e.g., mask 200, could be eliminated by increasing the dosage of the N+ implant sufficiently so that the subsequent P+ implant does not sufficiently change the N+ doped regions to render their doping levels less than that of an N+ doped region.

Thus, it will be seen that the additional N wells 72 and 103, as well as the additional P well 82, are formed without any additional masking or processing steps needed, since, as shown in FIG. 12, individual N wells 72 and 103, as well as individual P well 82, are all formed at the same time as main N well 50, and the mask used to form main N well 50 may be modified for use in the simultaneous formation of N wells 72 and 103 and P well 82, i.e., no additional mask need be used. Furthermore, the subsequent step of masking active regions of substrate 40 shown in FIG. 13, is carried out regardless of the presence of the additional individual N wells and P well, and the remaining steps illustrated in FIGS. 14-16 are also carried out regardless of the presence or absence of the additional individual wells.

Therefore, using the structure and process of the invention, the energy dissipation capacity of the disclosed SCR structure may be increased sufficiently to handle the energy or power from a 2 kV HBM zapping mode with a circuitry width of less than 2.5 mils (63.5 µm) with an average junction depth of 0.2 µm or less, to provide the required ESD protection for integrated circuit structures such as I/O buffer circuits without, however, adding further processing steps or additional masking steps to the process.

Figure 17:
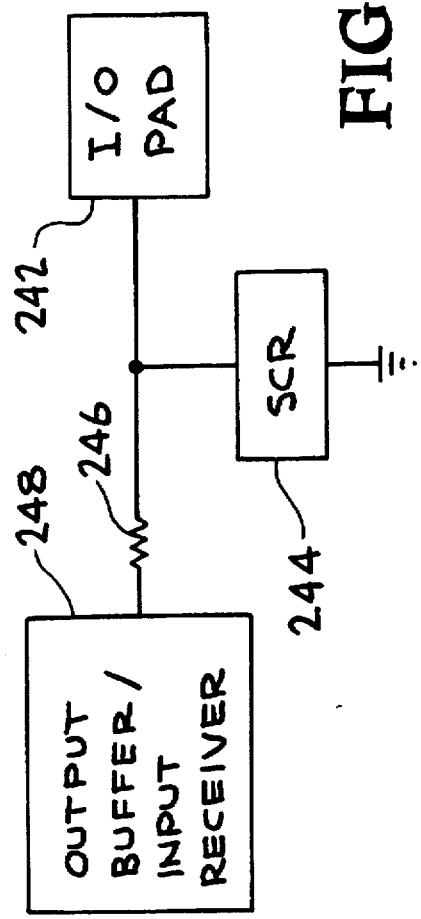
FIG. 17 shows, in diagram form, the relationship of the I/O pad, the SCR structure (which comprises the primary ESD protection structure) the ESD resistor, and the output buffer and/or input receiver section for the N drivers and P drivers which provides secondary ESD protection for the remainder of the integrated circuit structure.

While the structure and process of the invention have been illustrated with respect to their use with the primary ESD protection structure for an integrated circuit structure, and particularly with respect to the I/O buffers, the structure and process of the invention may also be used in connection with the CMOS devices used as ESD diodes, as well as with the CMOS used for the buffer drivers for output buffers, to provide secondary ESD protection for the integrated circuit structure. FIG. 17 shows, in diagram form, the relationship of I/O pad 242, the primary ESD protection structure comprising the SCR structure denoted at 244, the ESD resistor 246, and the output buffer and/or input receiver section 248 for the N drivers and P drivers which provides secondary ESD protection for the remainder of the integrated circuit structure electrically connected thereto.

Figure 18:
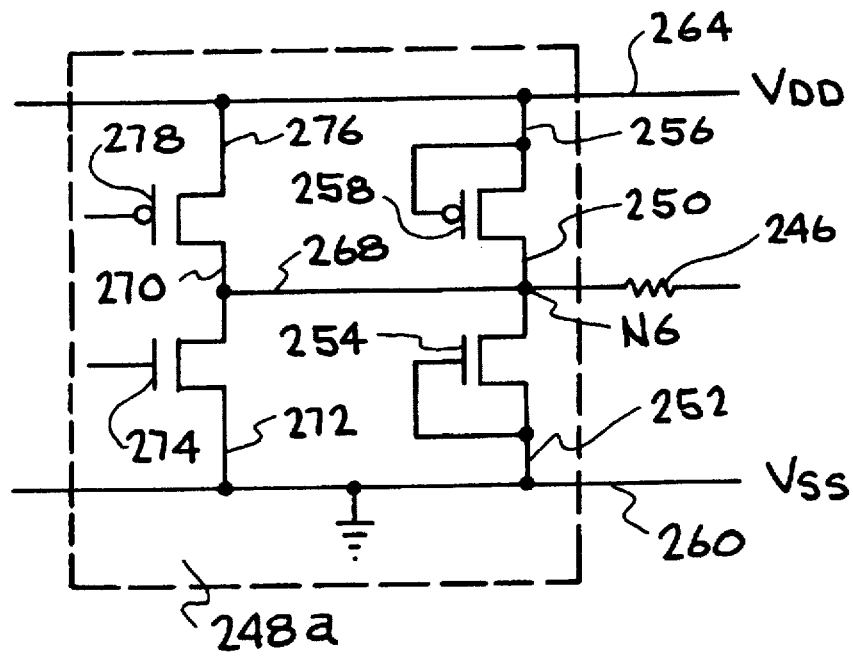
FIG. 18 is a schematic view of the electrical circuitry defined by an output driver for an output buffer located between the ESD resistor and the remainder of the integrated circuit structure.
Figure 19:
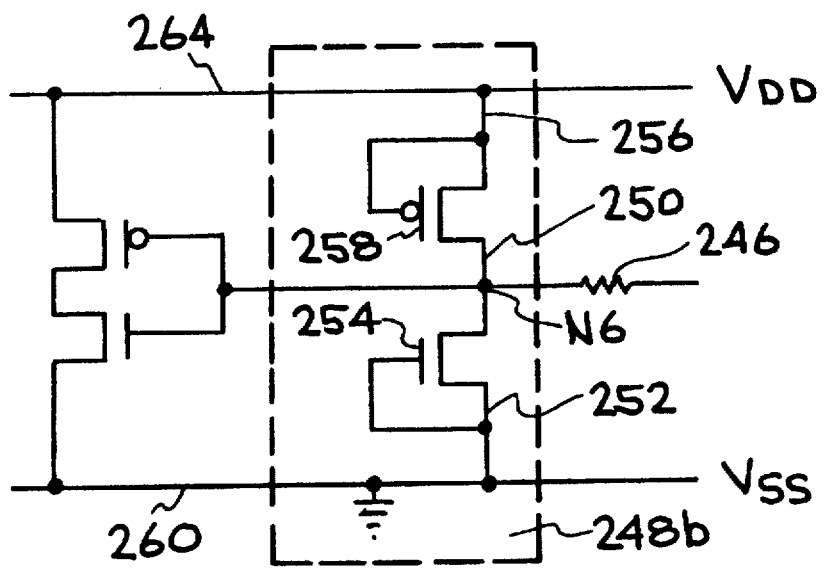
FIG. 19 is a schematic view of the electrical circuitry defined by an input receiver structure located between the ESD resistor and the remainder of the integrated circuit structure.

Specific circuitry for the secondary ESD protection structure is shown in FIGS. 18 and 19. In FIG. 18, an output driver structure 248a is illustrated wherein ESD resistor 246 is shown connected at node N6 to the common drain 250 of a CMOS structure, wherein a source 252 and a gate 254 of the NMOS portion of the CMOS structure are connected to ground, i.e., a Vss bus 260, while a source 256 and gate 258 of the PMOS portion of the CMOS structure is electrically connected to a power (Vdd) bus 264. N6 is further connected to a second CMOS structure in output buffer 248a by a line 268. The second CMOS structure in output buffer 248a comprises a common drain 270 connected to line 268, an NMOS source 272 connected to Vss ground bus 260, and an NMOS gate electrode 274 which is connected to the remainder of the integrated circuit structure. The second CMOS structure further comprises a PMOS source 276 connected to Vdd power bus 264 and a PMOS gate electrode 278 which is also connected to the remainder of the integrated circuit structure. Each of these NMOS and PMOS source and drain regions in both of the CMOS structures may have their effective volumes increased, in accordance with the invention, to increase their effectiveness as ESD protective structures, by providing an individual well physically and electrically contacting the individual N+ or P+ source or drain region, as will be described further below.

FIG. 19 shows an input receiver structure located between ESD resistor 246 and the remainder of the integrated circuit structure with the portion 248b encompassed by the dotted lines and comprising the ESD diode portion of the input receiver structure. In this structure ESD diode portion 248b provides the ESD protection. It will be recognized that ESD diode structure 248b is identical to the first CMOS structure of output buffer 248a of FIG. 18 so the numerals in FIG. 19 for the components of ESD diode 248b are identical to the numerals used in FIG. 18 to describe the first CMOS structure. The second CMOS structure shown in FIG. 19 does not form part of the ESD protection and therefore will not be further described herein.

Thus, the structure and process of the invention may be applied to the formation of the common first CMOS structure of both the output buffer structure of FIG. 18 and the input receiver structure of FIG. 19, as well as the second CMOS structure of FIG. 18, to enhance the energy or power dissipation of all of the respective illustrated CMOS structures within the dotted lines to provide improved ESD protection to the integrated circuit structures associated therewith.

Figure 20:
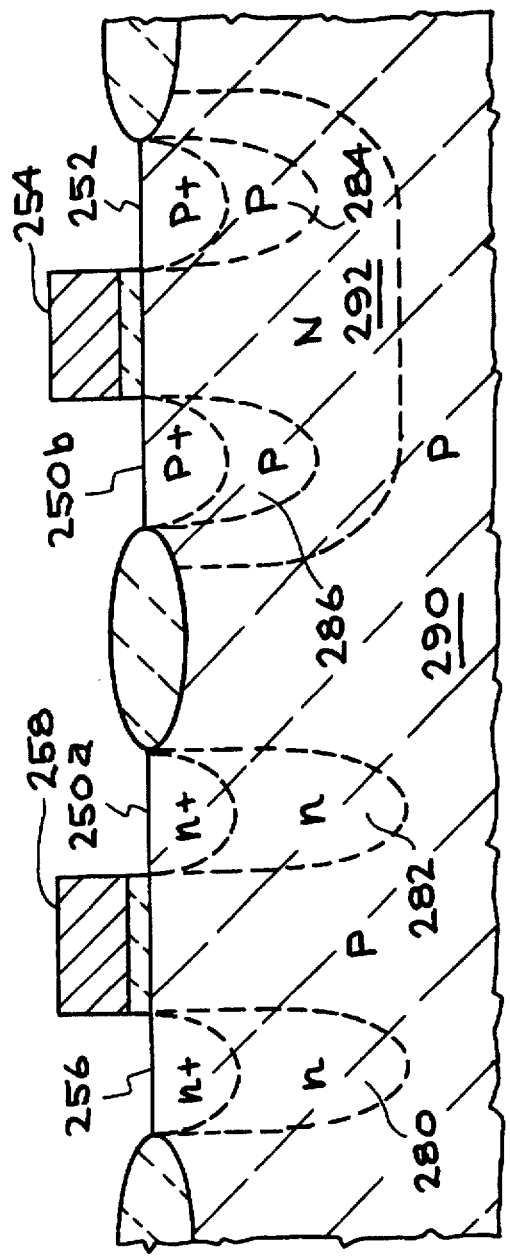
FIG. 20 is a fragmentary vertical side section view of the of the ESD diode structure of the input receiver of FIG. 19, showing the individual N wells and P wells formed below the respective P+ and N+ regions in accordance with the invention.

Referring now to FIG. 20, the ESD diode structure 248b of the input receiver of FIG. 19 is shown in cross-section along its length, with individual N wells and P wells shown formed below the respective P+ and N+ sources and drains in accordance with the invention. Thus, an individual N well 280 is shown formed below (and in contact with) N+ source region 256 of the PMOS device formed in P type substrate 290 and an N well 282 is shown formed below (and in contact with) drain region 250a of the PMOS device, while an individual P well 284 is shown formed below (and in contact with) P+ source region 252 of the NMOS device formed in main N well 292, and an individual P well 286 is shown below (and in contact with) P+ drain region 250b of the NMOS device. It will be noted here that common drain region 250 shown in FIG. 18, i.e., the common drain for both the PMOS and NMOS devices comprising the CMOS structure, is illustrated as an N+ drain region 250a and a P+ drain region 250b, it being understood that drain regions 250a and 250b will be electrically connected together by a suitable polysilicon, metal silicide, or metal interconnect at a subsequent stage in the construction of the integrated circuit structure.

Figure 21:
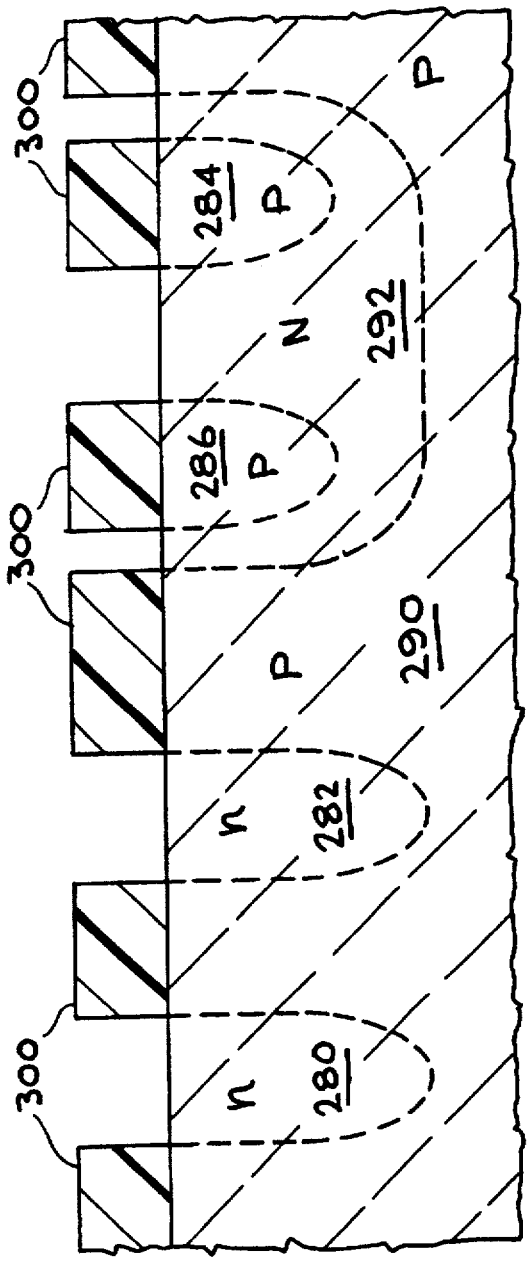
FIG. 21 is a fragmentary vertical side section view illustrating a preferred method of forming the structure shown in FIG. 20 wherein no additional processing steps or masks are utilized.

FIG. 21 shows a preferred method of forming the structure shown in FIG. 20 wherein no additional processing steps or masks are utilized. In this embodiment, the individual N wells 280 and 282 and P wells 284 and 286 for the respective N+ and P+ source and drain regions are formed simultaneously with the formation of main N well 292 for the PMOS device of the CMOS structure. This method, which is substantially the same as that previously illustrated in FIGS. 12 and 13, utilizes a common mask 300 for the simultaneous formation of all of the individual N wells and P wells, as well as main N well 292, in P doped substrate 290. As in the previously described method of FIGS. 12 and 13, it will be recognized that the method may also be used with an N doped substrate wherein all of the individual N wells and P wells, as well as the main P well, would then be formed simultaneously in the N doped substrate using a common mask.

It should be recognized that while FIGS. 18 and 19 respectively show an output buffer circuit and an input receiver, the two structures may be combined into a common structure and the invention will be accordingly applied to those portions of the common structure which provide the ESD protection. It should also be noted that whether designed as separate or combined circuits, the enhanced ESD protection provided by the invention for the output buffer/input receiver structure, i.e., the secondary ESD protection structure, may be sufficient to permit elimination of the primary ESD protection structure, i.e., SCR structure 244 and ESD resistor 246, which would result in yet a further savings in layout area used to provide the ESD-protected I/O structures of the integrated circuit structure.

It should also be noted that while the respective N wells and P wells have been illustrated as formed directly below the respective N+ and P+ source and drain regions, the respective N wells and P wells may be formed offset (but still touching) the respective N+ and P+ source and drain regions, including under adjacent field oxide portions, as discussed and illustrated with respective to the previous embodiment having the SCR structure formed therein.

Having thus described the invention what is claimed is:

1. A process for forming an electrostatic discharge (ESD) protection structure capable of protecting portions of an integrated circuit structure from damage from ESD comprising the steps of:

a) providing a semiconductor substrate of a first conductivity type;

b) forming a first mask over said substrate having:

i) first and second spaced apart openings in said first mask for formation of single main well of a second conductivity type in said substrate, said first and second openings being spaced sufficiently apart to also form a well of said first conductivity type in said substrate at a depth shallower than the depth of said main well; and ii) at least two further openings in said first mask spaced apart from one another and from said first and second openings for forming individual wells of said second conductivity type in said substrate;

c) forming said main well and said individual wells of said second conductivity type in said substrate beneath said openings in said first mask by implanting said semiconductor substrate through said openings in said first mask with dopant capable of forming said wells in said substrate of said second conductivity type beneath said openings, while simultaneously forming said shallower well of said first conductivity type beneath said first mask between said first and second openings in said first mask and surrounded beneath the surface of said substrate by said main well;

d) masking said substrate with a second mask to form field oxide portions in said substrate, with openings in said field oxide in registry with said individual wells and further openings in said field oxide for providing contact regions to said substrate and said main well;

e) forming a gate oxide over an exposed portion of said substrate not covered with said field oxide between said individual wells formed beneath said two further openings in said first mask;

f) forming an electrode over said gate oxide, comprising the gate electrode of an SCR;

g) masking said openings in said field oxide over said individual well of said first conductivity type and over said contact opening to said substrate with a third mask, and implanting an upper part of said main well and said individual wells of said second conductivity type with sufficient dopant of said second conductivity type to form:

i) a + doped region of said second conductivity type in said upper part of one of said individual wells comprising the source region of said SCR;

ii) a + doped region of said second conductivity type in said upper part one of said individual wells comprising a floating drain region of said SCR and the base of at least one bipolar transistor; and iii) a + doped source region of said second conductivity type in said upper part of said main well comprising a contact to said main well, and serving as the collector of said at least one bipolar transistor;

h) masking said structure and implanting a portion of said substrate and an upper portion of said shallower well with sufficient dopant of said first conductivity type through a fourth mask to form:

i) a + doped region of said first conductivity type in said upper part of said shallower well comprising an emitter region of said at least one bipolar transistor; and ii) a + doped region of said first conductivity type in said upper part of said substrate comprising a contact to said substrate;

to thereby provide an ESD protection structure comprising an SCR and at least one bipolar transistor capable of protecting portions of an integrated circuit structure from damage from ESD, with enhanced current carrying capability compared to a structure not having said individual wells beneath said + doped regions without, however, increasing the lateral dimensions of said ESD protection structure.

2. The process of claim 1 wherein said first conductivity type is P type, said second conductivity type is N type, and said main well is an N type well.

3. The process of claim 1 wherein said first conductivity type is N type, said second conductivity type is P type, and said main well is a P type well.

4. A process for forming an electrostatic discharge (ESD) protection structure capable of protecting portions of an integrated circuit structure from damage from ESD comprising the steps of:

a) providing a P type semiconductor substrate;

b) forming a first mask over said substrate having:

i) first and second spaced apart openings therein for formation of a main N well in said substrate, said first and second openings being spaced sufficiently apart to also form a P well in said substrate, comprising a portion of said p type substrate, at a depth shallower than the depth of said main N well; and ii) at least two further openings therein spaced apart from one another and from said first and second openings for forming individual N wells in said substrate;

c) forming said main N well and said individual N wells in said P type substrate beneath said openings in said first mask by implanting said semiconductor substrate through said openings in said first mask with N type dopant, while simultaneously forming said shallower P well beneath said first mask between said first and second openings in said first mask and surrounded beneath the surface of said substrate by said main N well;

d) masking said substrate with a second mask to form field oxide portions in said substrate, with openings in said field oxide in registry with said individual wells and further openings in said field oxide for providing contact regions to said substrate and said main well;

e) forming a gate oxide over an exposed portion of said substrate not covered with said field oxide between said individual N wells formed beneath said two further openings in said first mask;

f) forming an electrode over said gate oxide, comprising the gate electrode of an SCR;

g) masking said openings in said field oxide over said shallower P well and over said contact opening to said substrate with a third mask, and implanting an upper part of said main well and said individual wells with sufficient N dopant to form:

i) an N+ region in said upper part of one of said individual N wells in said P type substrate comprising the source region of said SCR;

ii) an N+ region in said upper part of one of said individual N wells in said P type substrate comprising a floating drain region of said SCR and the base of at least one bipolar transistor; and iii) an N+ region of said second conductivity type in said upper part of said main N well comprising a contact to said main N well, and serving as the collector of said at least one bipolar transistor;

h) masking said structure and implanting a portion of said substrate and an upper portion of said shallower P well with sufficient P type dopant through a fourth mask to form:

i) a P+ region in said upper part of said shallower P well comprising an emitter region of said at least one bipolar transistor; and ii) a P+ region in said upper part of said substrate comprising a contact to said substrate;

to thereby provide an ESD protection structure comprising an SCR and at least one bipolar transistor capable of protecting portions of an integrated circuit structure from damage from ESD with enhanced current carrying capability compared to a structure not having said individual wells beneath said N+ and P+ regions without, however, increasing the lateral dimensions of said ESD protection structure.

* * * * *